(12) United States Patent
Kim et al.

(10) Patent No.: US 8,895,971 B2
(45) Date of Patent: Nov. 25, 2014

(54) ORGANIC LIGHT EMITTING DISPLAY DEVICE AND METHOD FOR FABRICATING THE SAME

(71) Applicant: LG Display Co., Ltd., Seoul (KR)

(72) Inventors: Eun-Ah Kim, Chungcheongnam-do (KR); Joon-Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 74 days.

(21) Appl. No.: 13/721,319

(22) Filed: Dec. 20, 2012

(65) Prior Publication Data

US 2014/0054555 A1 Feb. 27, 2014

(30) Foreign Application Priority Data

Aug. 22, 2012 (KR) .......................... 10-2012-0091765

(51) Int. Cl.
*H01L 35/24* (2006.01)
*H01L 51/56* (2006.01)
*H01L 27/32* (2006.01)

(52) U.S. Cl.
CPC .............. *H01L 27/322* (2013.01); *H01L 51/56* (2013.01)

USPC .................... 257/40; 257/79; 438/22; 438/82

(58) Field of Classification Search
CPC ...... H01L 51/56; H01L 27/32; H01L 27/3258
USPC .................................. 257/40, 79; 438/22, 82
See application file for complete search history.

(56) References Cited

U.S. PATENT DOCUMENTS 6,512,504 B1 * 1/2003 Yamauchi et al. .............. 345/87
8,247,819 B2 * 8/2012 Kim et al. ........................ 257/72

* cited by examiner

*Primary Examiner* — Theresa T Doan
(74) *Attorney, Agent, or Firm* — Morgan, Lewis & Bockius LLP (57) ABSTRACT

The organic light emitting display device includes a substrate, a thin film transistor formed on the substrate, a protective film formed to cover the thin film transistor, a color filter layer formed on the substrate exposed by removing a gate insulating layer of the thin film transistor and the protective film, an overcoat layer formed over the entire surface of the substrate to cover the color filter layer and the protective film, a drain contact hole exposing the thin film transistor by selectively removing the protective film and the overcoat layer, and a first electrode connected to the thin film transistor through the drain contact hole on the overcoat layer, a white organic light emitting layer formed on the first electrode, and a second electrode formed to cover the white organic light emitting layer.

6 Claims, 7 Drawing Sheets

FIG. 1

Related Art

Related Art

FIG. 4B

ORGANIC LIGHT EMITTING DISPLAY DEVICE AND METHOD FOR FABRICATING THE SAME

This application claims the benefit of Korean Patent Application No. 10-2012-0091765, filed on Aug. 22, 2012 which is hereby incorporated by reference as if fully set forth herein.

BACKGROUND OF THE INVENTION

1. Field of the Invention

The present invention relates to an organic light emitting display device, and more particularly, to an organic light emitting display device with improved color quality and a method of fabricating the same.

2. Discussion of the Related Art

For an image display device which displays a variety of information on a screen as a core technology in advanced information and communication, there is continuous progress in development of thin, light-weight, and portable devices with improved performance. Hereupon, an organic light emitting display device for controlling light intensity of an organic light emitting layer is recently receiving attention as a flat panel display device, along with demand for a flexible display capable of being bent pursuant to convenience and space utilization.

The organic light emitting display device includes a thin film transistor (TFT) array part formed on a substrate, an organic light emitting display panel disposed on the TFT array part, and an encapsulation layer to isolate the organic light emitting display panel from the external environment. The organic light emitting display device applies an electric field to a first electrode and a second electrode formed at both ends of an organic light emitting layer so as to inject and transport electrons and holes into the organic light emitting layer, thereby utilizing an electroluminescence phenomenon which emits light by binding energy during recombination of the electrons and holes. The electrons and holes, which are paired with each other in the organic light emitting layer, emit light while falling from an excited state to a ground state.

In detail, in the organic light emitting display device, a plurality of sub-pixels is defined by intersections of gate lines and data lines. Each of the sub-pixels receives a data signal from the data line when a gate pulse is supplied to the gate line, resulting in generating light corresponding to the data signal.

Hereinafter, a conventional organic light emitting display device will be described with reference to FIG. 1.

Figure 1:
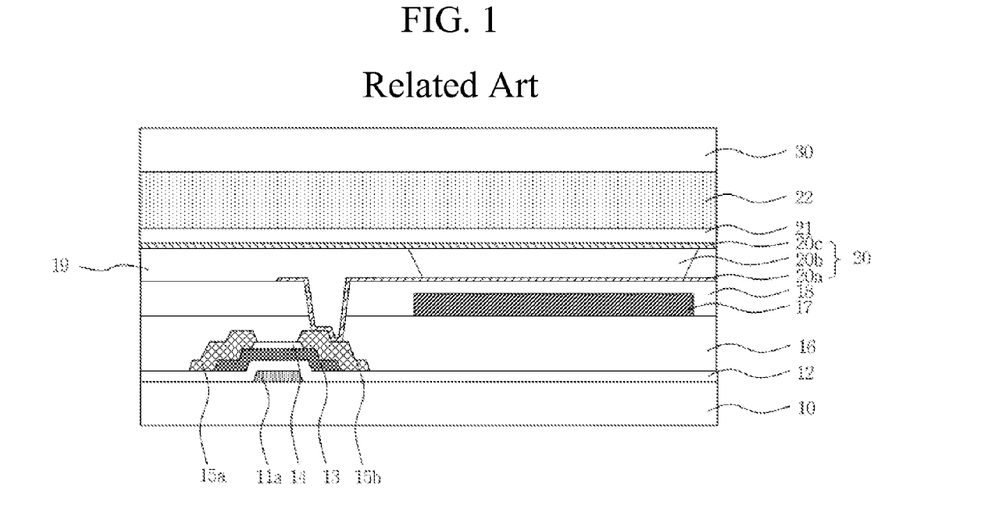
FIG. 1 is a cross-sectional view illustrating a conventional organic light emitting display device.

FIG. 1 is a cross-sectional view illustrating a conventional organic light emitting display device.

As shown in FIG. 1, the conventional organic light emitting display device includes a substrate 10, a TFT formed on the substrate 10, a protective film 16 formed to cover the TFT, a color filter layer 17 formed on the protective film 16, an overcoat layer 18 formed to cover the color filter layer 17, and an organic light emitting cell 20 formed over the overcoat layer 18. The organic light emitting cell 20 includes a first electrode 20a, an organic light emitting layer 20b, and a second electrode 20c sequentially stacked.

The TFT includes a gate electrode 11a, a gate insulating layer 12, a semiconductor layer 13, a source electrode 15a, and a drain electrode 15b. If the semiconductor layer 13 is an oxide semiconductor layer, the TFT further includes an etch stop layer (ESL) 14 formed on the semiconductor layer 13.

The first electrode 20a is electrically connected to a drain electrode 15b through a drain contact hole (not shown) formed by selectively removing the protective film 16 and the overcoat layer 18. A bank 19 having a bank hole that exposes a portion of the first electrode 20a to define a luminescent region is formed on the overcoat layer 18. Then, the organic light emitting layer 20b is formed in the bank hole, and the second electrode 20c is formed over the entire surface of the organic light emitting layer 20b.

Such an organic light emitting cell 20 emits light by binding energy generated while holes from the first electrode 20a and electrons from the second electrode 20c are injected into the organic light emitting layer 20b and combined with each other. In addition, an encapsulation layer may further be formed on the second electrode 20c for capping the organic light emitting cell 20.

The encapsulation layer is attached to the organic light emitting cell 20 via a face seal 22 disposed on one surface of a glass cap 30. Particularly, in order to prevent inflow of moisture and oxygen into the organic light emitting layer 20b, an inorganic layer 21 may further be disposed between the face seal 22 and the second electrode 20c.

The organic light emitting display device may realize various colors of light using white light emitted from the organic light emitting layer 20b while the white light from the organic light emitting layer 20b passes through the color filter layer 17 formed in each of the sub-pixels. However, since light emitted from the organic light emitting layer 20b sequentially passes through the overcoat layer 18, the color filter layer 17, the protective film 16, the gate insulating layer 12, and the substrate 10 and is emitted to the outside, color inversion is caused by wavelength interference of light according to viewing angle while passing through the protective film 16 and the gate insulating layer 12 having high indexes of refraction, thereby changing color coordinates according to the viewing angle.

SUMMARY OF THE INVENTION

Accordingly, the present invention is directed to an organic light emitting display device and a method of fabricating the same that substantially obviate one or more problems due to limitations and disadvantages of the related art.

An object of the present invention is to provide an organic light emitting display device in which light that has passed through a color filter is directly emitted to the outside via a substrate by removing a gate insulating layer and a protective layer with high indexes of refraction corresponding to emission regions in order to inhibit deterioration of color characteristics of light emitted from an organic light emitting layer according to viewing angle, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a substrate, a thin film transistor formed on the substrate, a protective film formed to cover the thin film transistor, a color filter layer formed on the substrate corresponding to a portion of a display region and exposed by removing a gate insulating layer of the thin film transistor and the protective film, an overcoat layer formed over the entire surface of the substrate to cover the color filter layer and the protective film, a drain contact hole exposing the thin film transistor by selectively removing the protective film and the overcoat layer, a first electrode connected to the thin film transistor through the drain contact hole on the overcoat layer, a white organic light emitting layer formed on the first electrode, and a second electrode formed to cover the white organic light emitting layer.

White light emitted by the white organic light emitting layer may be discharged to the outside sequentially through the overcoat layer, the color filter layer, and the substrate The color filter layer and the overcoat layer may have the same index of refraction.

The indexes of refraction of the gate insulating layer and the protective film may be greater than indexes of refraction of the substrate and the color filter layer.

One edge of the protective film formed in the display region of the substrate may be disposed at the same position of one edge of the gate insulating layer.

The gate insulating layer and the protective film may be formed of the same material.

In another aspect of the present invention, a method of fabricating an organic light emitting display device includes forming a thin film transistor on a substrate, forming a protective film over the entire surface of the substrate to cover the thin film transistor, exposing a portion of a display region of the substrate by selectively removing a gate insulating layer of the thin film transistor and the protective film, and simultaneously forming a drain contact hole pattern exposing the thin film transistor by selectively removing the protective film, forming a color filter layer on the exposed substrate, forming an overcoat layer over the entire surface of the substrate to cover the color filter layer and the protective film, forming a drain contact hole exposing the thin film transistor by selectively removing the overcoat layer in accordance with the drain contact hole pattern, and forming a first electrode connected to the thin film transistor via the drain contact hole on the overcoat layer, forming a white organic light emitting layer on the first electrode, and forming a second electrode to cover the white organic light emitting layer, on the overcoat layer.

White light emitted by the white organic light emitting layer may be discharged to the outside sequentially through the overcoat layer, the color filter layer, and the substrate.

The gate insulating layer and the protective film may be selectively removed such that one edge of the protective film formed in the display region of the substrate is disposed at the same position of one edge of the gate insulating layer.

The gate insulating layer and the protective film may be formed of the same material.

The exposing a portion of the display region of the substrate by selectively removing the gate insulating layer of the thin film transistor and the protective film, and simultaneously forming the drain contact hole pattern exposing the thin film transistor by selectively removing the protective film may be performed using a half tone mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting display device and a method of fabricating the organic light emitting display device will be described in detail.

Figure 2:
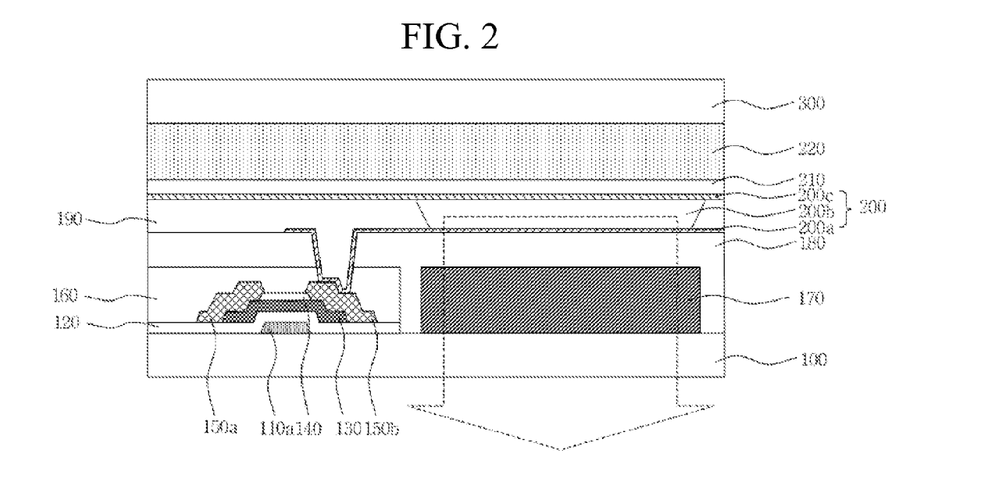
FIG. 2 is a cross-sectional view illustrating an organic light emitting display device according to the present invention.

FIG. 2 is a cross-sectional view illustrating an organic light emitting display device according to the present invention.

As shown in FIG. 2, the organic light emitting display device includes a thin film transistor (TFT) formed on a substrate 100, a protective film 160 formed to cover the TFT, a color filter layer 170 formed on the substrate 100 exposed by removing a gate insulating layer 120 of the TFT and the protective film 160, an overcoat layer 180 formed over the entire surface of the substrate 100 to cover the protective film 160 and the color filter layer 170, and an organic light emitting cell 200 formed over the overcoat layer 180.

The TFT and the organic light emitting cell 200 are formed in display regions of the substrate 100. Although not shown herein, gate pads connected to gate lines and data pads connected to data lines are disposed in non-display regions of the substrate 100.

In detail, a plurality of sub-pixels is defined by intersections of gate lines (not shown) and data lines (not shown) disposed such that the gate insulating layer 120 is interposed therebetween in the display regions of the substrate 100. The TFT is formed at the intersection of the gate line (not shown) and the data line (not shown).

The TFT may be selected from the group consisting of an oxide TFT using an oxide such as indium gallium zinc oxide (IGZO), zinc oxide (ZnO), and titanium oxide (TiO) as a semiconductor layer, an organic TFT using an organic material as a semiconductor layer, an amorphous silicon TFT using amorphous silicon as a semiconductor layer, and a poly silicon TFT using poly silicon as a semiconductor layer. Here, an oxide TFT is illustrated in the drawings.

The oxide TFT has advantages such as higher charge mobility and lower leakage current characteristics, compared with the silicon TFT including a silicon semiconductor layer. Furthermore, since the silicon TFT is fabricated via a high-temperature process by crystallizing the silicon semiconductor layer, uniformity decreases during the crystallization process as the area of the silicon semiconductor layer increases. Thus, the silicon TFT is not suitable to a large area. On the other hand, the oxide TFT may be processed at a low temperature so as to be suitable to a large area.

In detail, the oxide TFT includes a gate electrode 110a that is formed by protruding from a gate line (not shown) or is defined as a portion of the gate line, a gate insulating layer 120 formed to cover the gate electrode 110a and expose the substrate 100 correspond to a portion of the display region, a semiconductor layer 130 formed on the gate insulating layer 120 and overlapping the gate electrode 110a, an etch stop layer (ESL) 140 formed on the semiconductor layer 130, a source electrode 150a connected to the data line (not shown) and formed on the ESL 140, and a drain electrode 150b spaced apart from the source electrode 150a and formed on the ESL 140.

In this regard, the protective film 160 is formed to cover the TFT and expose the substrate 100 corresponding to a portion of the display region. The gate insulating layer 120 and the protective film 160 may be formed of an inorganic material such as $SiO_x$, $SiN_x$, and $Al_2O_3$. Particularly, the gate insulating layer 120 and the protective film 160 may be formed of the same material, and one edge of the protective film 160 is disposed at the same position of one edge of the gate insulating layer 120.

R, G, and B color filter layers 170 are formed on the exposed portions of the substrate 100 in the sub-pixels, and thus R, G, and B sub-pixels are defined. In this regard, if the thickness of the color filter layer 170 is too large, optical transmittance is reduced. On the other hand, if the thickness of the color filter layer 170 is too small, a color reproduction rate is reduced. Accordingly, the thickness of the color filter layer 170 may be about 1 µm. Particularly, in a W sub-pixel where the color filter layer 170 is not formed, the protective film 160 and the gate insulating layer 120 are also formed such that the substrate 100 corresponding to a portion of the display region is exposed.

As described above, the R, G, and B sub-pixels including the color filter layers 170 realize various colors of light using white light emitted by an organic light emitting layer 200b passing through the color filter layers 170. In addition, the W sub-pixel not including the color filter layer 170 realizes white light as it is emitted from the organic light emitting layer 200b.

Then, the overcoat layer 180 is formed over the entire surface of the substrate 100 provided with the color filter layer 170 and the protective film 160. The overcoat layer 180 is formed over the entire surface of the W sub-pixel in which the color filter layer 170 is not formed as well as the entire surfaces of the R, G, and B sub-pixels in which the color filter layers 170 are formed. Particularly, since the color filter layer 170 is not formed in the W sub-pixel, the overcoat layer 180 is formed to cover the entire exposed surface of the substrate 100.

In addition, the drain electrode 150b is exposed through a drain contact hole (not shown) formed by selectively removing the overcoat layer 180 and the protective film 160. The organic light emitting cell 200 including a first electrode 200a, the organic light emitting layer 200b, and a second electrode 200c sequentially stacked is formed on the overcoat layer 180. In detail, the first electrode 200a is electrically connected to the drain electrode 150b exposed through the drain contact hole (not shown). The first electrode 200a that constitutes an anode is formed of a transparent conductive material such as tin oxide (TO), indium tin oxide (ITO), indium zinc oxide (IZO), and indium tin zinc oxide (ITZO).

A bank 190 having a bank hole exposing a portion of the first electrode 200a is formed on the first electrode 200a to define a luminescent region, and the organic light emitting layer 200b is formed of a white organic light emitting material in the bank hole. Then, the second electrode 200c is formed on the organic light emitting layer 200b. The second electrode 200c that constitutes a cathode is formed of a reflective metallic material such as aluminum (Al) to reflect light generated in the organic light emitting layer 200b toward the first electrode 200a.

Although not shown herein, a hole injection layer and a hole transport layer may further be formed between the first electrode 200a and the organic light emitting layer 200b. The hole injection layer and the hole transport layer are disposed to facilitate injection of holes into the organic light emitting layer 200b. An electron injection layer and an electron transport layer may further be formed between the organic light emitting layer 200b and the second electrode 200c. The electron injection layer and the electron transport layer are disposed to facilitate injection of electrons into the organic light emitting layer 200b.

In the organic light emitting display device as described above, when a voltage is applied between the first electrode 200a and the second electrode 200c, holes injected from the first electrode 200a and electrons injected from the second electrode 200c are recombined in the organic light emitting layer 200b, thereby generating excitons. The excitons emit light while falling to a ground state. As described above, while passing through the color filter layers 170 disposed under the organic light emitting cell 200, light corresponding to each color filter layer 170 is emitted to the outside via the substrate 100.

That is, in the organic light emitting display device according to the present invention, light emitted by the organic light emitting layer 200b is discharged to the outside through the overcoat layer 180, the color filter layer 170, and the substrate 100.

A conventional organic light emitting display device includes the overcoat layer 180, the color filter layer 170, the protective film 160, and the gate insulating layer 120 between the organic light emitting layer 200b and the substrate 100. However, while indexes of refraction of the color filter layer 170, the overcoat layer 180, and the substrate 100 are in the range of about 1.3 to about 1.6, indexes of refraction of the gate insulating layer 120 and the protective film 160 are 2.0 or greater. Thus, color coordinates may vary according to viewing angle, thereby deteriorating color characteristics.

However, in the organic light emitting display device according to the present invention, the gate insulating layer 120 and the protective film 160 which are formed of high refractive index-inorganic materials are removed between the overcoat layer 180 and the color filter layer 170, and the color filter layer 170 is formed directly on the substrate 100. Thus, since light from the organic light emitting layer 200b is emitted to the outside through the overcoat layer 180, the color filter layer 170, and the substrate 100 which have similar indexes of refraction, deterioration of color characteristics according to viewing angle may be prevented.

In addition, an encapsulation layer may further be formed on the second electrode 200c for capping the organic light emitting cell 200. The encapsulation layer is attached to the organic light emitting cell 200 by a face seal 220 formed on one surface of a glass cap 300. Particularly, in order to prevent inflow of moisture and oxygen into the organic light emitting layer 200b, an inorganic layer 210 such as $AlO_x$, SiN, and a metallic film may further be formed between the face seal 220 and the second electrode 200c.

Meanwhile, although not shown herein, the gate pad includes a gate pad lower electrode formed on the same layer as the gate electrode 110a, a gate contact hole exposing the gate pad lower electrode by selectively removing the gate insulating layer 120, the protective film 160, and the overcoat layer 180, and a gate pad upper electrode formed on the same layer as the first electrode 200a and electrically connected to the exposed gate pad lower electrode.

In addition, the data pad includes a data pad lower electrode formed on the same layer as the source electrode 150a, a data contact hole exposing the data pad lower electrode by selectively removing the protective film 160 and the overcoat layer 180, and a data pad upper electrode formed on the same layer as the first electrode 200a and electrically connected to the exposed data pad lower electrode.

Hereinafter, a method of fabricating an organic light emitting display device according to the present invention will be described in detail.

FIGS. 3A to 3L are cross-sectional views for describing a method of fabricating an organic light emitting display device according to the present invention.

Figure 3A:
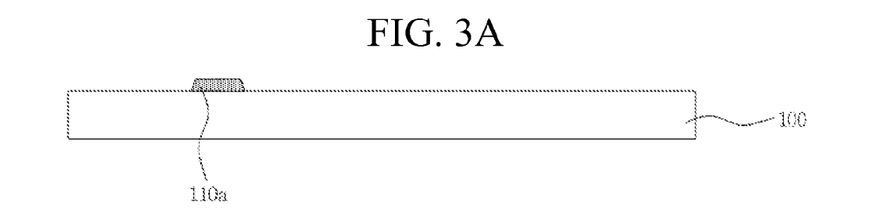
FIGS. 3A to 3L are cross-sectional views for describing a method of fabricating an organic light emitting display device according to the present invention.

As shown in FIG. 3A, a gate line (not shown) and a gate electrode 110a are formed in a display region of a substrate 100. Although not shown herein, one end of the gate line (not shown) extends to a non-display region of the substrate 100, and a gate pad lower electrode is formed on the end of the gate line (not shown). A gate insulating layer 120 is formed over the entire surface of the substrate 100 provided with the gate line (not shown), the gate electrode 110a, and the gate pad lower electrode (not shown) using an inorganic material such as $SiO_x$, $SiN_x$, and $Al_2O_3$.

Figure 3B:
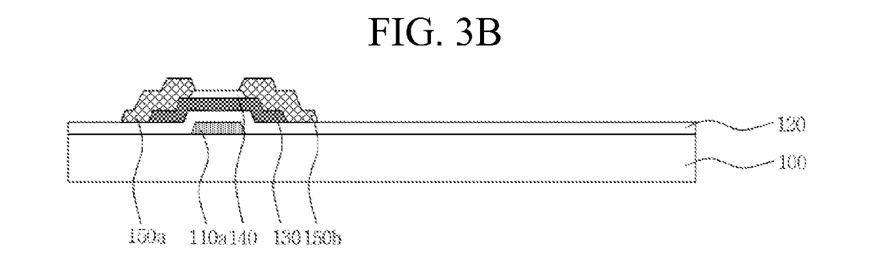

Then, as shown in FIG. 3B, a semiconductor layer 130 is formed on the gate insulating layer 120 to overlap the gate electrode 110a, and an etch stop layer (ESL) 140 is formed on the semiconductor layer 130. Then, a data line (not shown) intersecting the gate line (not shown) is formed such that the gate insulating layer 120 is disposed therebetween to define a plurality of sub-pixels. A source electrode 150a connected to the data line (not shown) and a drain electrode 150b spaced apart from the source electrode 150a are formed. Although not shown herein, one end of the data line (not shown) extends to the non-display region of the substrate 100, and a data pad lower electrode is formed at the end of the data line (not shown).

The TFT formed as described above is an oxide TFT using indium gallium zinc oxide (IGZO), zinc oxide (ZnO), titanium oxide (TiO), or the like as the semiconductor layer 130. If required, the TFT may also be selected from the group consisting of an organic TFT using an organic material as the semiconductor layer 130, an amorphous silicon TFT using amorphous silicon as the semiconductor layer 130, and a poly silicon TFT using poly silicon as the semiconductor layer 130.

Figure 3C:
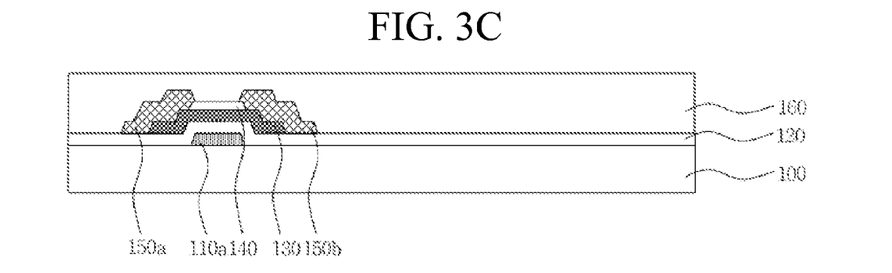
Figure 3D:
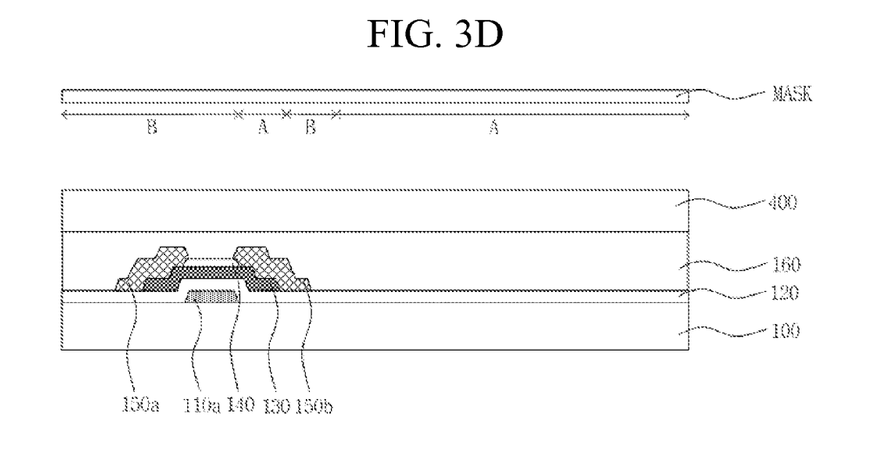

Then, as shown in FIG. 3C, a protective film 160 is formed of an inorganic material such as $SiO_x$, $SiN_x$, and $Al_2O_3$ over the entire surface of the substrate 100 including the display region and the non-display region to cover the TFT. In this regard, the protective film 160 may be formed of the same material as the gate insulating layer 120. In addition, as shown in FIG. 3D, the gate pad lower electrode (not shown) and the data pad lower electrode (not shown) disposed in the non-display region of the substrate 100 are exposed by selectively removing the gate insulating layer 120 and the protective film 160. Simultaneously, a drain contact hole pattern 160a exposing the drain electrode 150b is formed by selectively removing the protective film 160, and the protective film 160 and the gate insulating layer 120 are removed to expose the substrate 100 corresponding to a portion of the display region.

In this regard, the protective film 160 and the gate insulating layer 120 are removed using a photoresist pattern formed using a mask MASK having a transmission region A and a cut-off region B as a mask as shown in FIG. 3D. The transmission region A of the mask MASK corresponds to a region from which the protective film 160 and gate insulating layer 120 are removed and a region in which the drain contact hole exposing the drain electrode 150a is formed. The cut-off region B corresponds to the other regions.

Figure 3E:
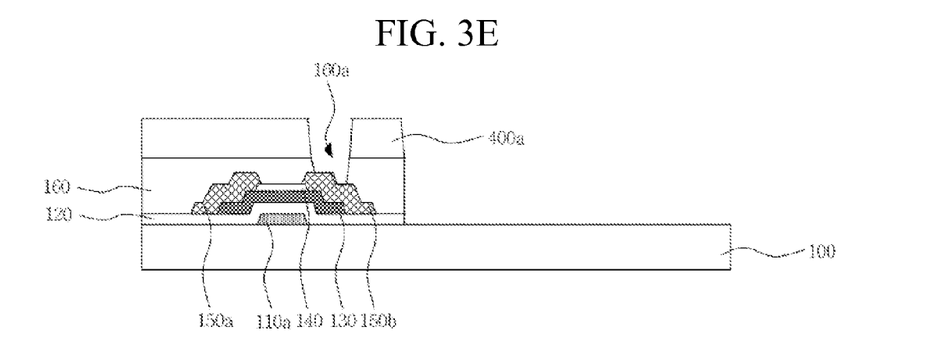

In detail, a photoresist 400 is coated on the protective film 160, and the mask MASK is disposed on the photoresist 400. Then the photoresist 400 is exposed to light using the mask MASK and developed to form a photoresist pattern 400a as shown in FIG. 3E. Then, the exposed protective film 160 and the gate insulating layer 120 are removed by using the photoresist pattern 400a as a mask to expose the substrate 100 corresponding to a portion of the display region. Simultaneously, the drain contact hole pattern 160a exposing the drain electrode 150b is formed. In this regard, since the gate insulating layer 120 and the protective film 160 are formed of the same material, one edge of the protective film 160 remaining in the display region is disposed at the same position of one edge of the gate insulating layer 120.

As described above, the drain contact hole pattern 160a is formed at the same time when the substrate 100 corresponding to a portion of the display region is exposed. If the protective film 160 and the gate insulating layer 120 are selectively removed using a half tone mask, the substrate 100 is exposed by removing the protective film 160 and the gate insulating layer 120 on the substrate 100 corresponding to the display region, and then the drain contact hole pattern 160a exposing the drain electrode 150a may be formed.

Figure 3F:
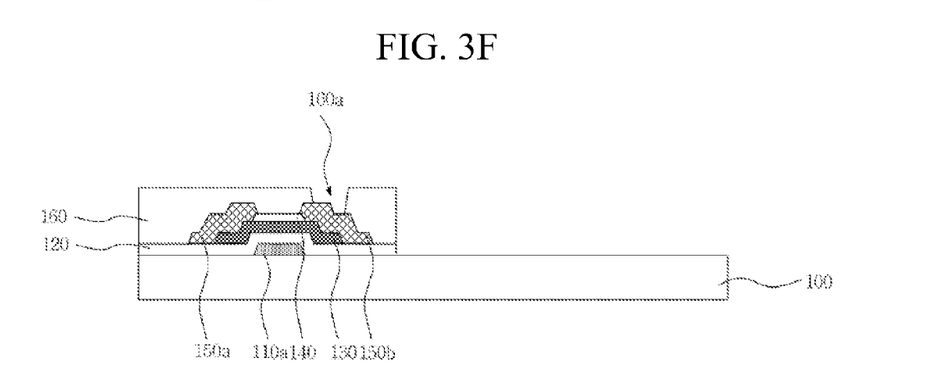
Figure 3G:
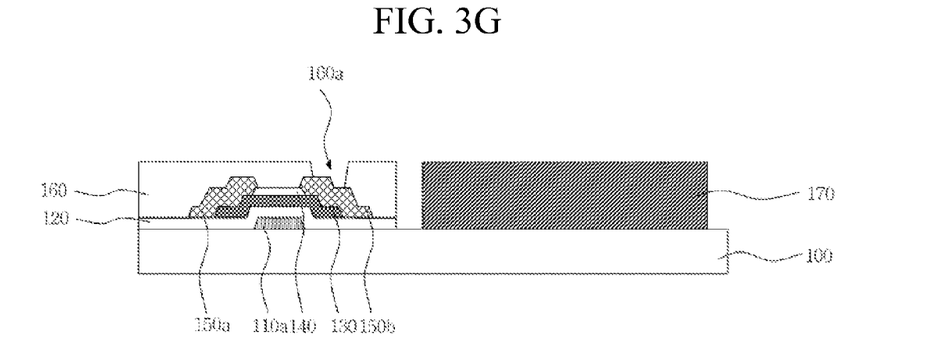

Then, the photoresist pattern 400a is removed as shown in FIG. 3F, and R, G, and B color filter layers 170 are formed on the exposed substrate 100 of each sub-pixel as shown in FIG. 3G. The sub-pixels including the R, G, and B color filter layers are respectively defined as R, G, and B sub-pixels. Particularly, in the W sub-pixel in which the color filter layer 170 is not formed, the protective film 160 and the gate insulating layer 120 are also removed to expose the substrate 100 corresponding to a portion of the display region.

As described above, the R, G, and B sub-pixels including the color filter layers 170 realize various colors of light using white light emitted from an organic light emitting layer to be described later passing through the color filter layers 170. In addition, the W sub-pixel in which the color filter layer 170 is not formed realizes white color as it is emitted from the organic light emitting layer.

Figure 3H:
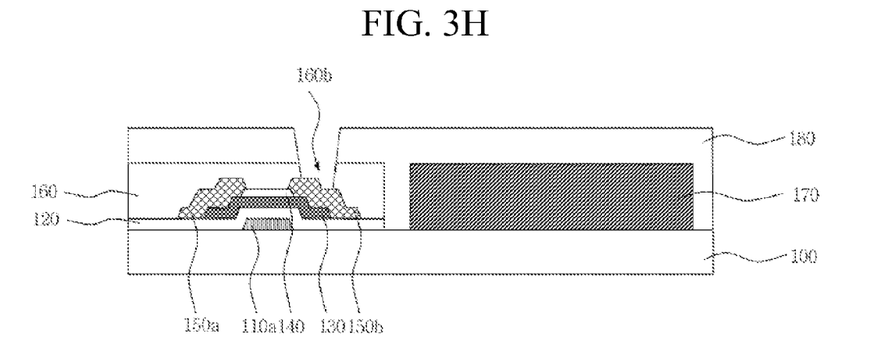

Then, as shown in FIG. 3H, an overcoat layer 180 is formed over the entire surface of the substrate 100. In this regard, the overcoat layer 180 is formed not only over the entire surface of the R, G, and B sub-pixels including the color filter layers 170 but also over the entire surface of the W sub-pixel in which the color filter layer 170 is not formed. Particularly, since the color filter layer 170 is not formed in the W sub-pixel, the overcoat layer 180 of the W sub-pixel is formed to cover the entire surface of the exposed substrate 100.

Then, the overcoat layer 180 is selectively removed to form a drain contact hole 160 exposing the drain electrode 150b in accordance with the drain contact hole pattern 160a of the display region. Simultaneously, the gate contact hole exposing the gate pad lower electrode (not shown) in the non-display region of the substrate 100 and the data contact hole exposing the data pad lower electrode are formed.

As described above, the overcoat layer 180 is separately removed from the protective film 160 and the gate insulating layer 120 when the drain electrode 150b and the gate pad lower electrode (not shown) and the data pad lower electrode (not shown) are exposed. If the overcoat layer 180 and the protective film 160 are simultaneously patterned, the protective film 160 is removed in a reverse tapered shape, so that contacts may not be properly formed between the first electrode and the drain electrode 150b, between the gate pad upper electrode and the gate pad lower electrode, and between the data pad upper electrode and the data pad lower electrode.

Figure 3I:
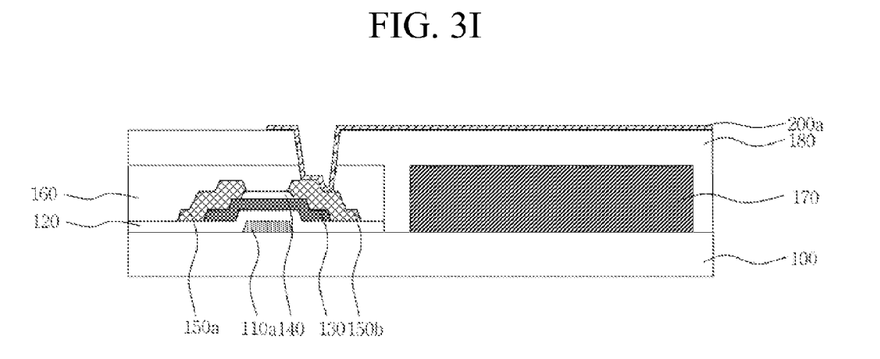

Then, as shown in FIG. 3I, a transparent conductive material such as tin oxide (TO), indium tin oxide (ITO), indium zinc oxide (IZO), and indium tin zinc oxide (ITZO) are deposited over the entire surface of the substrate 100 provided with the overcoat layer 180 and patterned to form the first electrode 200a connected to the drain electrode 150b. Simultaneously, the gate pad upper electrode (not shown) connected to the gate pad lower electrode (not shown) via the gate contact hole (not shown) and the data pad upper electrode (not shown) connected to the data pad lower electrode (not shown) via the data contact hole (not shown) are also formed in the non-display region.

Figure 3J:
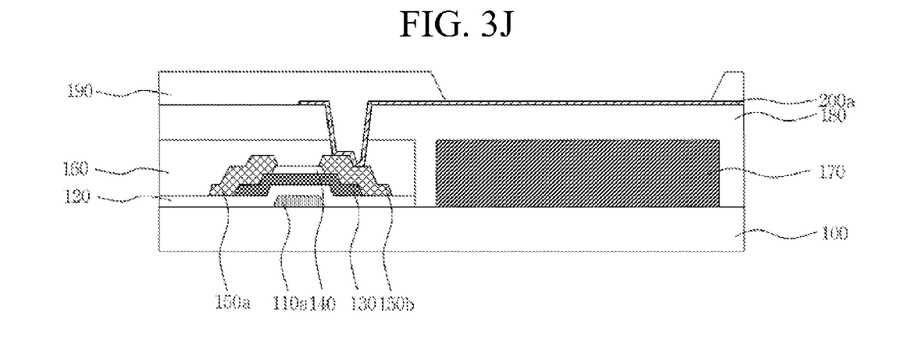
Figure 3K:
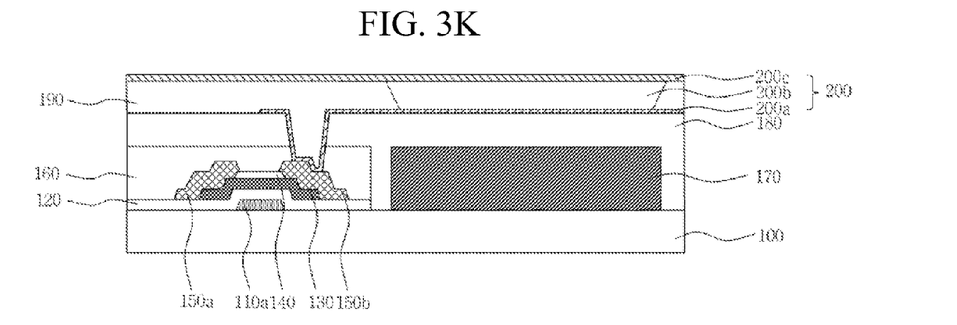

Then, as shown in FIG. 3J, a bank 190 having a bank hole partially exposing the first electrode 200a is formed in order to define a luminescent region of the display region on the first electrode 200a. In addition, as shown in FIG. 3K, an organic light emitting layer 200b is formed on the first electrode 200a exposed by the bank hole. Since the organic light emitting layer 200b is formed of a white organic light emitting material, white light from the organic light emitting layer 200b is emitted to the outside through the overcoat layer 180, the color filter layer 170, and the substrate 100. In addition, a second electrode 200c is formed to cover the organic light emitting layer 200b. The second electrode 200c that constitutes a cathode is formed of a reflective metallic material such as aluminum (Al). Thus, the second electrode 200c reflects white light emitted from the organic light emitting layer 200b toward the first electrode 200a.

Although not shown herein, a hole injection layer and a hole transport layer may further be formed between the first electrode 200a and the organic light emitting layer 200b. The hole injection layer and the hole transport layer are disposed to facilitate injection of holes into the organic light emitting layer 200b. In addition, an electron injection layer and an electron transport may further be formed between the organic light emitting layer 200b and the second electrode 200c. The electron injection layer and the electron transport layer are disposed to facilitate injection of electrons into the organic light emitting layer 200b.

In the organic light emitting display device as described above, when a voltage is applied between the first electrode 200a and the second electrode 200c, holes injected from the first electrode 200a and electrons injected from the second electrode 200c are recombined in the organic light emitting layer 200b, generating excitons. The excitons emit light while falling to a ground state. While passing through the color filter layers 170 disposed under the organic light emitting cell 200, light corresponding to each color filter layer 170 is emitted to the outside through the substrate 100.

Figure 3L:
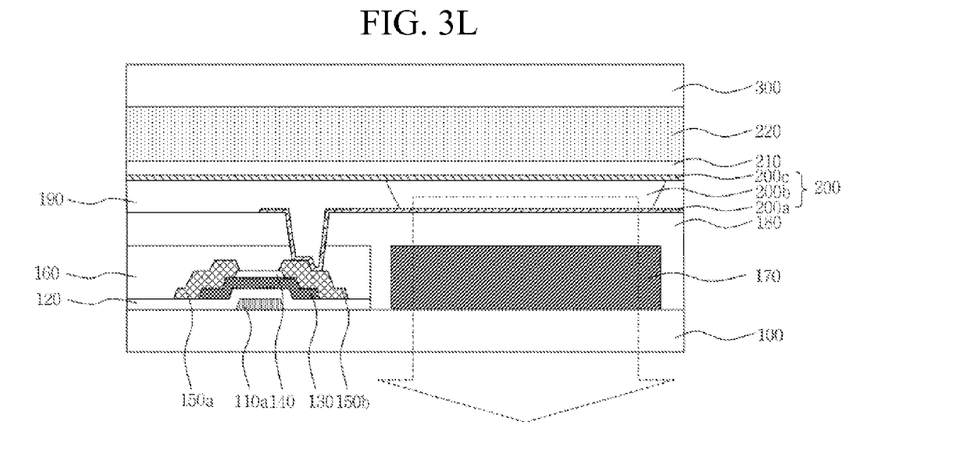

Then, as shown in FIG. 3L, in order to prevent inflow of external moisture and oxygen into the organic light emitting layer 200b, an inorganic layer 210 is disposed over the entire surface of the second electrode 200c. For capping the organic light emitting cell 200, a face seal 220 formed on one surface of a glass cap 300 is attached to the inorganic layer 210.

According to the method of fabricating the organic light emitting display device according to the present invention, the substrate 100 is exposed without using a separate mask process, and the color filter layer 170 is formed directly on the exposed substrate 100. Thus, light from the organic light emitting layer 200c may be emitted to the outside through the overcoat layer 180, the color filter layer 170, and the substrate 100 which have similar indexes of refraction. Accordingly, deterioration of color characteristics according to the viewing angle may be prevented.

Figure 4A:
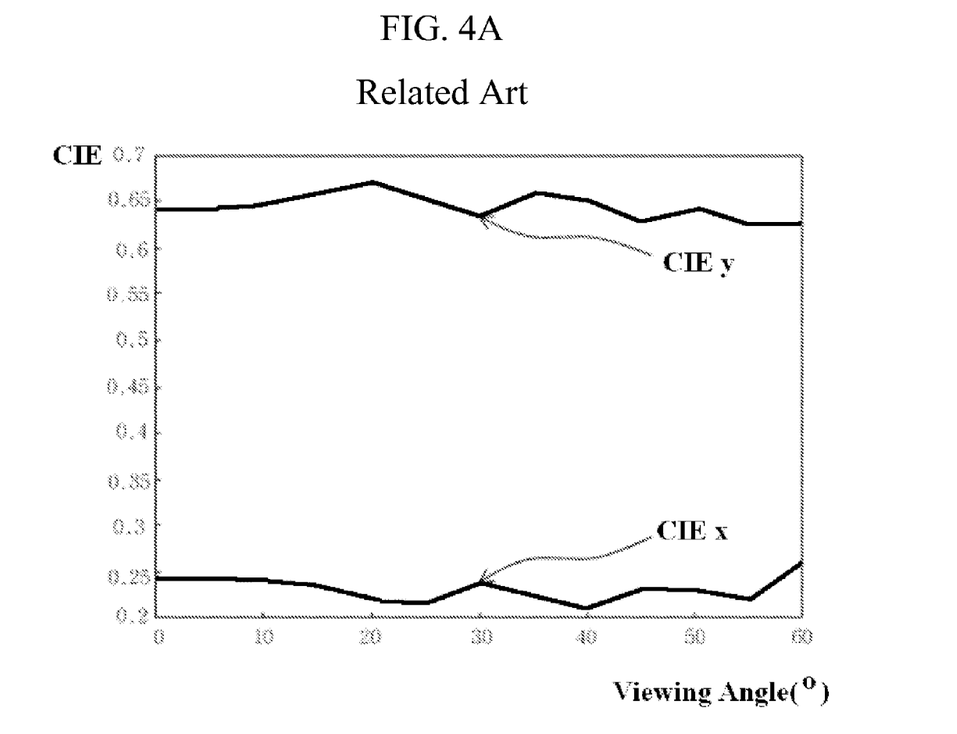
FIG. 4A is a graph illustrating color characteristics of a conventional organic light emitting display device with respect to viewing angle.
Figure 4B:
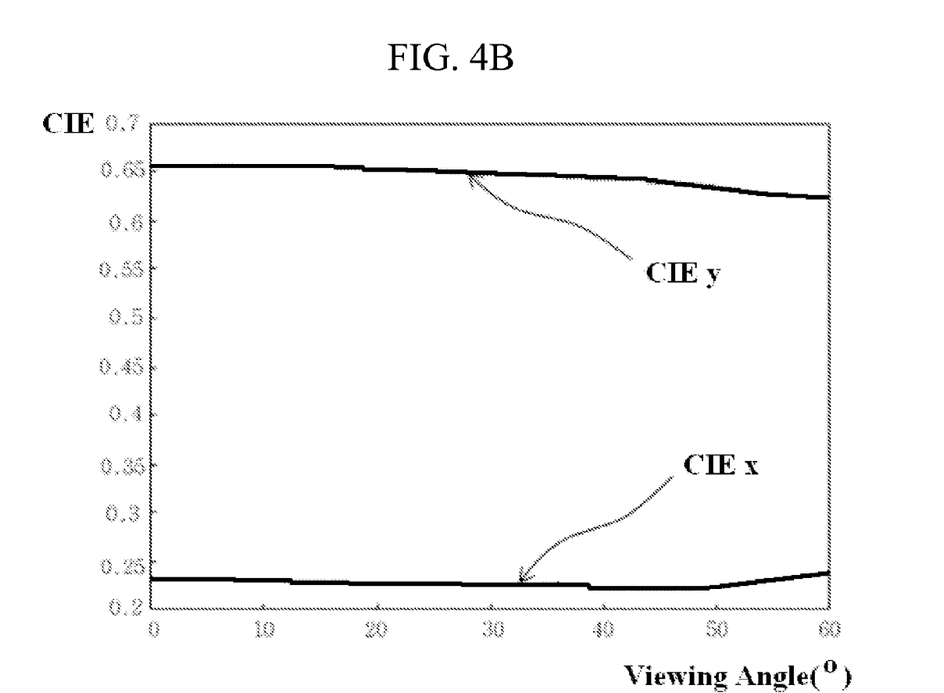
FIG. 4B is a graph illustrating color characteristics of an organic light emitting display device with respect to the present invention.

FIG. 4A is a graph illustrating color characteristics of a conventional organic light emitting display device with respect to viewing angle. FIG. 4B is a graph illustrating color characteristics of an organic light emitting display device according to the present invention with respect to viewing angle.

In the conventional organic light emitting display device, light from the organic light emitting layer is emitted to the outside through the overcoat layer, the color filter layer, the protective film, the gate insulating layer, and the substrate. Thus, while light transmitted through the color filter layer passes through the protective film and the gate insulating layer having high indexes of refraction, wavelength interference of light occurs. Accordingly, as shown in FIG. 4A, color coordinates (CIE x, CIE y) vary according to viewing angle, thereby deteriorating color characteristics.

However, in the organic light emitting display device according to the present invention, the high refractive index-gate insulating layer 120 and protective film 160 are removed between the overcoat layer 180 and the color filter layer 170, and the color filter layer 170 is directly formed on the substrate 100. Thus, light from the organic light emitting layer 200c is emitted to the outside through the overcoat layer 180, the color filter layer 170, and the substrate 100 which have similar indexes of refraction. As a result, color coordinates (CIE x, CIE y) may be constantly maintained even when the viewing angle changes as shown in FIG. 4B. Therefore, deterioration of color characteristics according to the viewing angle may be prevented.

As is apparent form the above description, the organic light emitting display device has the following effects.

First, light emitted from the organic light emitting display panel is discharged to the outside through the overcoat layer, the color filter layer, and the substrate having similar indexes of refraction without passing through the high refractive index-gate insulating layer and protective layer by exposing the substrate by removing the gate insulating layer and the protective layer to correspond to a portion of the display region, and directly forming the color filter layer on the exposed substrate. As a result, deterioration of color characteristics according to the viewing angle may be prevented.

Second, since a process of removing the gate insulating layer and the protective layer is performed simultaneously with a process of exposing the drain electrode, deterioration of color characteristics may be prevented without using a separate mask process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate;
a thin film transistor formed on the substrate;
a protective film formed to cover the thin film transistor;
a color filter layer formed on the substrate corresponding to
a portion of a display region and exposed by removing a gate insulating layer of the thin film transistor and the protective film;

an overcoat layer formed over the entire surface of the substrate to cover the color filter layer and the protective film;

a drain contact hole exposing the thin film transistor by selectively removing the protective film and the overcoat layer;

a first electrode connected to the thin film transistor through the drain contact hole on the overcoat layer;

a white organic light emitting layer formed on the first electrode; and a second electrode formed to cover the white organic light emitting layer.

2. The organic light emitting display device of claim 1, wherein white light emitted by the white organic light emitting layer is discharged to the outside sequentially through the overcoat layer, the color filter layer, and the substrate.

3. The organic light emitting display device of claim 1, wherein the color filter layer and the overcoat layer have the same index of refraction.

4. The organic light emitting display device of claim 1, wherein the indexes of refraction of the gate insulating layer and the protective film are greater than indexes of refraction of the substrate and the color filter layer.

5. The organic light emitting display device of claim 1, wherein one edge of the protective film formed in the display region of the substrate is disposed at the same position of one edge of the gate insulating layer.

6. The organic light emitting display device of claim 1, wherein the gate insulating layer and the protective film are formed of the same material.

* * * * *